United States Patent
Dubin et al.

(10) Patent No.: US 6,841,458 B2
(45) Date of Patent: Jan. 11, 2005

(54) DOPANT INTERFACE FORMATION

(75) Inventors: Valery M. Dubin, Portland, OR (US); Jacob M. Faber, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 50 days.

(21) Appl. No.: 10/241,890

(22) Filed: Sep. 12, 2002

(65) Prior Publication Data

US 2004/0053441 A1 Mar. 18, 2004

(51) Int. Cl.[7] .............................................. H01L 21/04
(52) U.S. Cl. ...................................... 438/510; 438/106
(58) Field of Search ............................. 438/26, 51, 55, 438/64, 106, 108, 112, 122, 510, 524, 637, 643, 644, 680, 681, 692

(56) References Cited

U.S. PATENT DOCUMENTS

| | | | |
|---|---|---|---|
| 5,976,928 A | * 11/1999 | Kirlin et al. | 438/240 |
| 6,063,506 A | 5/2000 | Andricacos et al. | |
| 6,211,035 B1 | * 4/2001 | Moise et al. | 438/396 |
| 6,404,003 B1 | * 6/2002 | McMillan et al. | 257/306 |
| 6,444,542 B2 | * 9/2002 | Moise et al. | 438/448 |
| 6,518,070 B1 | * 2/2003 | Alluri et al. | 438/3 |
| 6,518,184 B1 | 2/2003 | Chambers et al. | |
| 2002/0084529 A1 | 7/2002 | Dubin et al. | |

FOREIGN PATENT DOCUMENTS

WO     WO 02/45142 A2    6/2002

OTHER PUBLICATIONS

Search Report for PCT/US 03/27792 mailed Jan. 21, 2004, 4 pages.

\* cited by examiner

*Primary Examiner*—David Nhu
(74) *Attorney, Agent, or Firm*—Blakely, Sokoloff, Taylor & Zafman LLP

(57) ABSTRACT

Formation of an interconnect circuit feature having a metal and an electropositive dopant. The interconnect feature may contain an accumulation of the electropositive dopant at interface boundaries of the interconnect feature to reduce electromigration of the metal during operation. In a method the interconnect feature may be heated to drive a portion of the electropositive dopant to the interfaces.

18 Claims, 7 Drawing Sheets

DOPANT INTERFACE FORMATION

FIELD OF THE TECHNOLOGY

The present invention relates generally to microelectronic device processing, and in particular to the use of doped metal in fabricating microelectronic devices.

BACKGROUND OF THE RELATED ART

In the fabrication of semiconductor devices, various materials may be deposited on a substrate for various purposes. For example, inter-layer dielectric (ILD) material may be deposited and patterned with trenches. Metal material may then be placed in the trenches to form interconnect lines, or "traces".

A barrier layer is often first formed within the trenches in an attempt to prevent diffusion of metal ions into the ILD material or the substrate during device operation. For example, a barrier layer of tantalum may first be deposited on the bottom and sides of a trench before filling in the remainder of the trench with a conductive metal material such as copper. This barrier layer may prevent ions of the conductive metal from diffusing beyond the trenches when current flows in the metal line during operation of the circuit. This diffusion, often referred to as electromigration, may eventually lead to the formation of voids in the metal lines, which may cause degraded operation or even failure of the device. Thus, the initial deposition of a barrier layer may be used to reduce electromigration over the expected operational life of the integrated circuit.

Unfortunately, a barrier layer formed as indicated above does not completely prevent diffusion or migration of all metal ions. For example, where copper is the metal deposited, even tantalum, a fairly good barrier for copper, is not able to prevent a significant amount of migration of copper ions out of the trenches. Copper is highly desirable for metal lines because it has high electrical conductivity and is easy to handle in the manufacturing operations. But it is also highly diffusive and often difficult to entirely isolate. As a result, the likelihood of electromigration-induced voids forming in copper metal lines formed in the convention manner is undesirably high.

DETAILED DESCRIPTION

In the following description, numerous specific details are set forth. However, it is understood that embodiments of the invention may be practiced without these specific details. In other instances, well-known structures and techniques have not been shown in detail in order not to obscure an understanding of this description.

References to "one embodiment", "an embodiment", "example embodiment", "various embodiments", etc., indicate that the embodiment(s) of the invention so described may include a particular feature, structure, or characteristic, but not every embodiment necessarily includes the particular feature, structure, or characteristic. Further, repeated use of the phrase "in one embodiment" does not necessarily refer to the same embodiment, although it may.

Some embodiments relate to a method of fabricating an electrically conductive interconnect structure (and/or to the electrically conductive interconnect structure formed by this method) in a microelectronic device by doping the metal material used to form the conductive structure, and subsequently annealing the conductive structure to drive the dopant material to the boundaries of the conductive structure. This concentration of dopant at the boundaries may reduce the degree of electromigration experienced by the conductive structure during operation. In a particular embodiment, the conductive structure is an interconnect structure including a conductive line and/or a via in a die or substrate. Although the following descriptions refer to various conductive structures as being metal (e.g., copper), various embodiments may use conductive non-metallic materials if those materials exhibit the same processing and electrical characteristics described herein for metal. The terms "line", "interconnect", and "trace", when used as nouns, may be used interchangeably herein.

Figure 1:
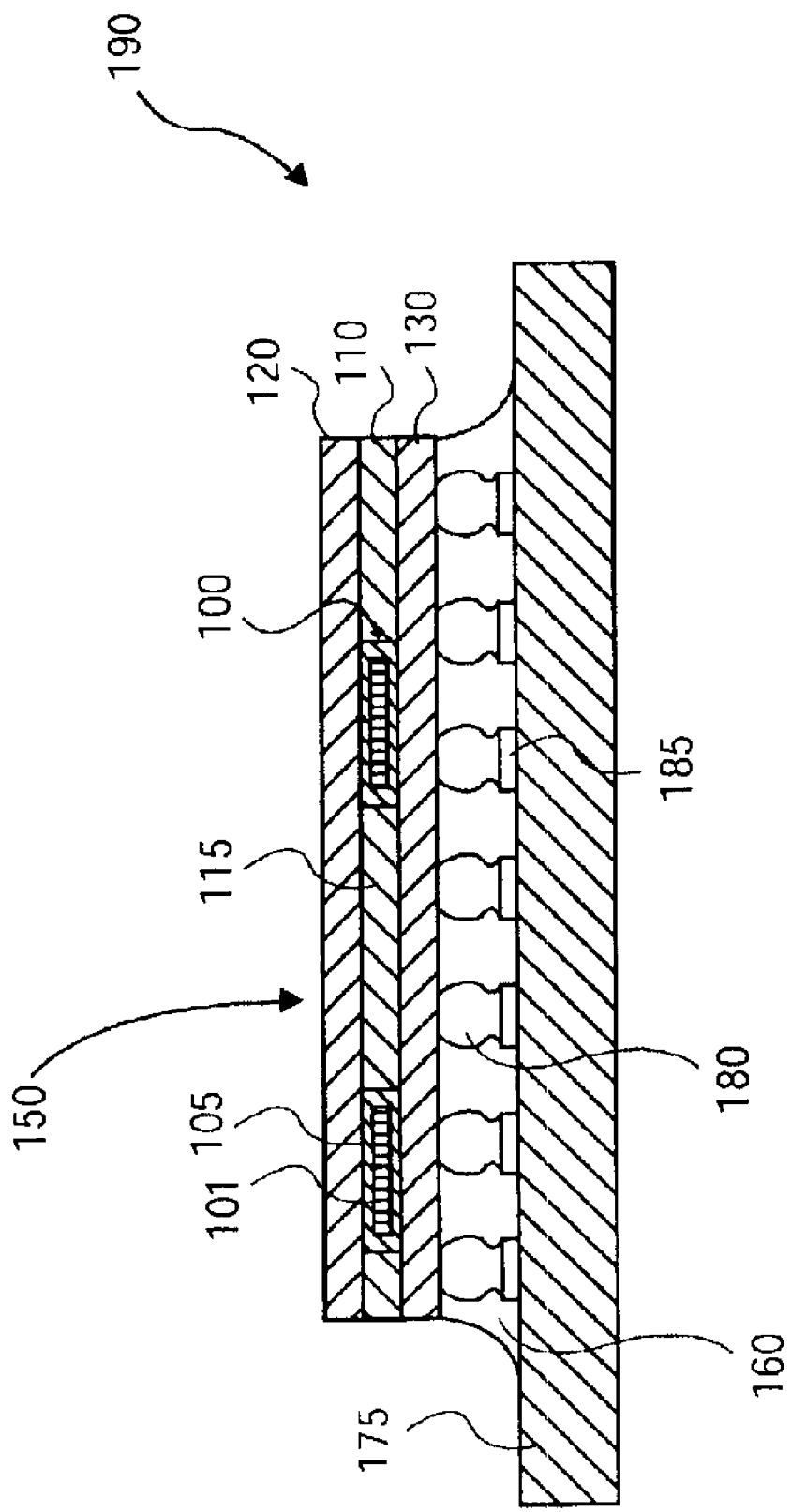
FIG. 1 shows a cross-sectional view of a semiconductor package and metal lines within it, according to one embodiment of the invention.

Referring now to FIG. 1, a semiconductor package 190 is shown. The semiconductor package 190 includes a package substrate 175 on which is mounted a die 150. The package substrate 175 may be configured for coupling to a printed circuit board (PCB) or other interface of an electronic device. In this manner, the package substrate 175 may act as an electronic and protective interface between the compact internal circuitry of the die 150 and the larger circuitry of the PCB.

In the illustrated embodiment, the die 150 is electrically coupled to the package substrate 175 by solder balls 180 at the lower surface of the die 150. The solder balls 180 are connected to bond pads 185 at the upper surface of the package substrate 175. The die 150 may be further secured to the package substrate 175 by an underfill adhesive material 160. The underfill adhesive material 160 may be of various materials, such as a conventional epoxy polymer.

Continuing with reference to the embodiment of FIG. 1, the die 150 includes a substrate 120 on which a circuit layer 110 has been fabricated. The circuit layer 110 includes inter-layer dielectric (ILD) material 115 patterned to accommodate metal circuit features or interconnects such as metal lines 100 (shown in cross-section). The metal lines 100 include metal 101 near the center and dopant interfaces 105 near the boundaries. Within the context of this disclosure, a dopant interface may be defined as a region at or near a boundary of a conductive structure that has a concentration of dopant material. Although shown in the drawing as distinct entities, the metal 101 and dopant interfaces 105 may gradually blend into one another, with the metal lines 100 having an increasing concentration of dopant near the boundaries.

The dopant material may include a material which is of electropositive potential and has low solubility in the metal used in metal lines 100. As described above, the dopant interfaces 105 may prevent or reduce the formation of voids within the metal lines 100 during operation. In addition, the electropositive potential of the dopant may help ensure adequate and efficient formation of the metal lines 100.

An additional layer 130 is shown adjacent the circuit layer 110. In one embodiment, the additional layer 130 may include internal circuitry isolated by ILD material. Additionally, embodiments of the additional layer 130 may actually include multiple layers of internal circuitry, including metal lines with dopant interfaces similar to the metal lines 100 of the circuit layer 110. In the embodiment shown, the circuit layer 110 and additional layer 130 are built up on the substrate 120 and the die is flipped over for electronic coupling as indicated above (e.g., a "flip chip"). For example, the additional layer 130 may include circuitry for coupling to the solder balls 180. However, it is not required that the die 150 be of a flip chip configuration as shown.

Figure 4:
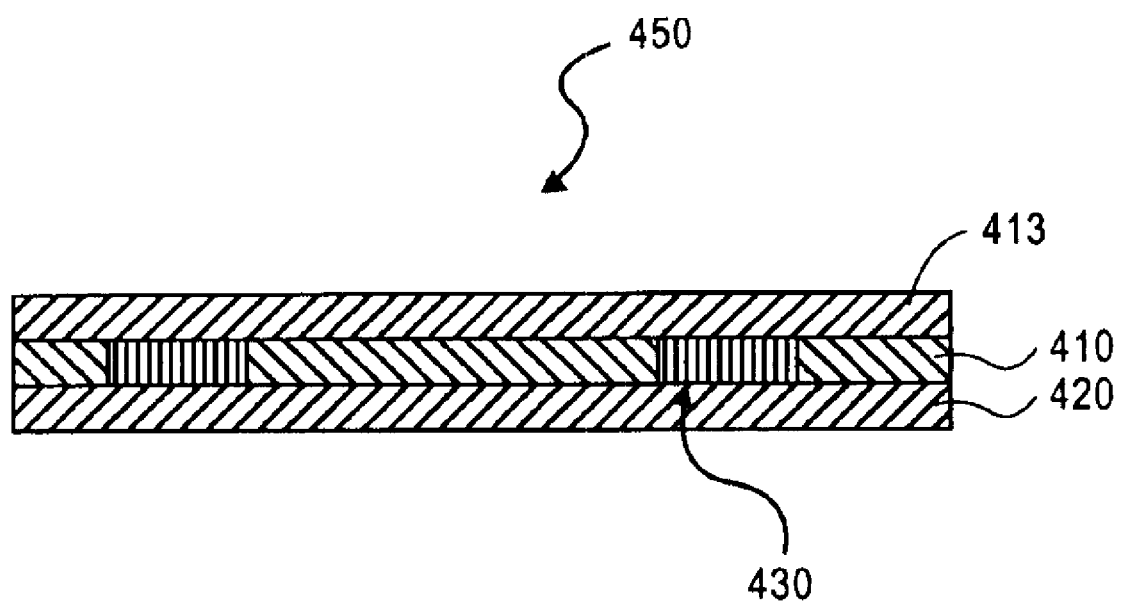
FIG. 4 is a cross-sectional view of a die containing metal lines, according to one embodiment of the invention.
Figure 5:
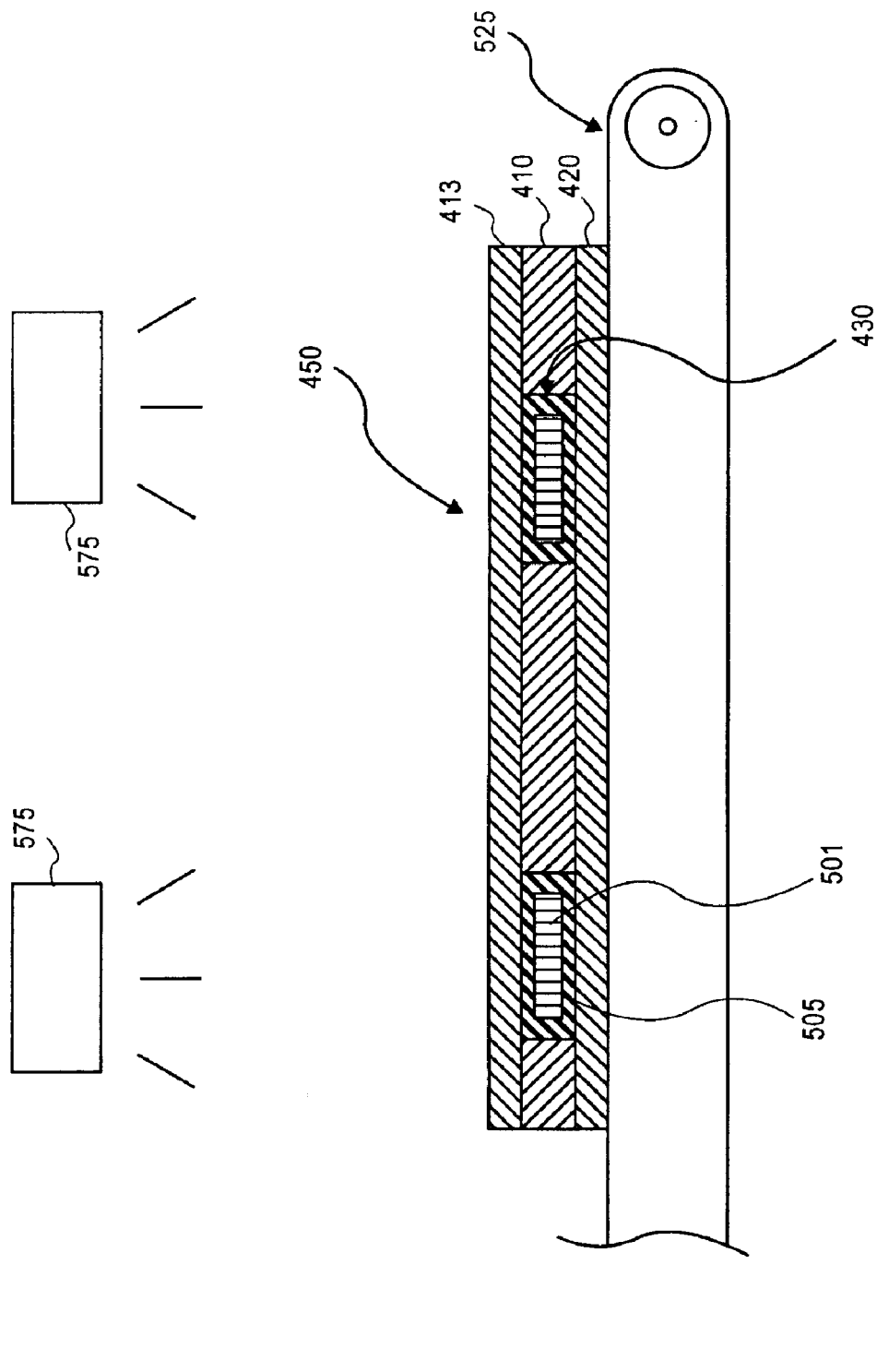
FIG. 5 is a cross-sectional view of the die of FIG. 4 during an annealing stage, according to one embodiment of the invention.
Figure 6:
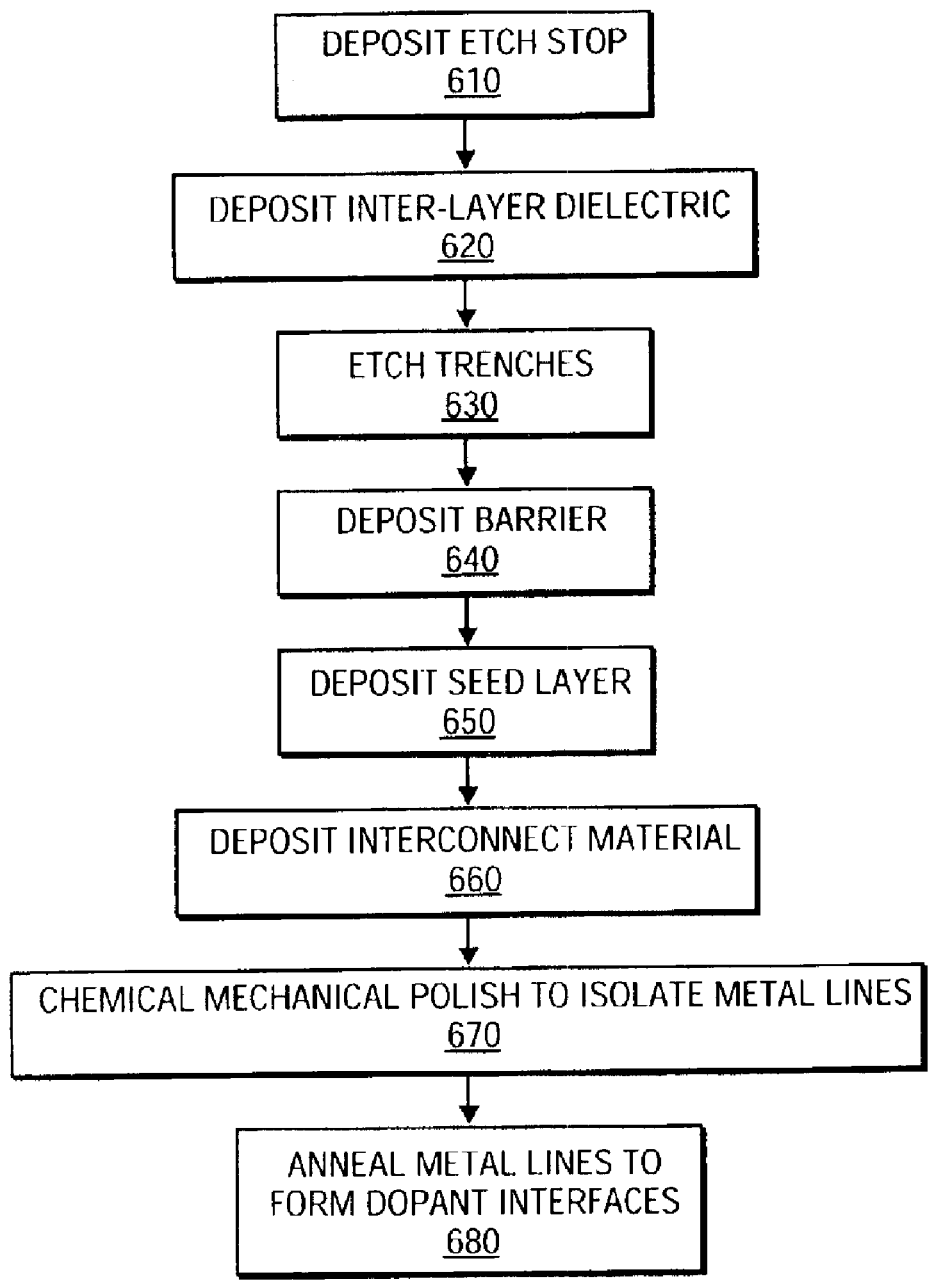
FIG. 6 is a flow chart of a method, according to one embodiment of the invention.

FIGS. 2–5 show various stages in the fabrication of a die, such as the die 150 shown in FIG. 1. The embodiments described with reference to FIGS. 2–5 show a cross-section of two metal lines. However, alternate embodiments of circuit features may use the same techniques to create conductive structures with other shapes and configurations, such as vias and combination lines/vias using dual damascene techniques. Additionally, FIG. 6 shows a flow chart of a method of forming the metal lines and/or other features described herein. Although various portions of the text refer both to FIG. 6 and to one or more of FIGS. 2–5, it is obvious that the method embodiment of FIG. 6 and the device embodiment of FIGS. 2–5 may be practiced independently of each another.

Figure 2:
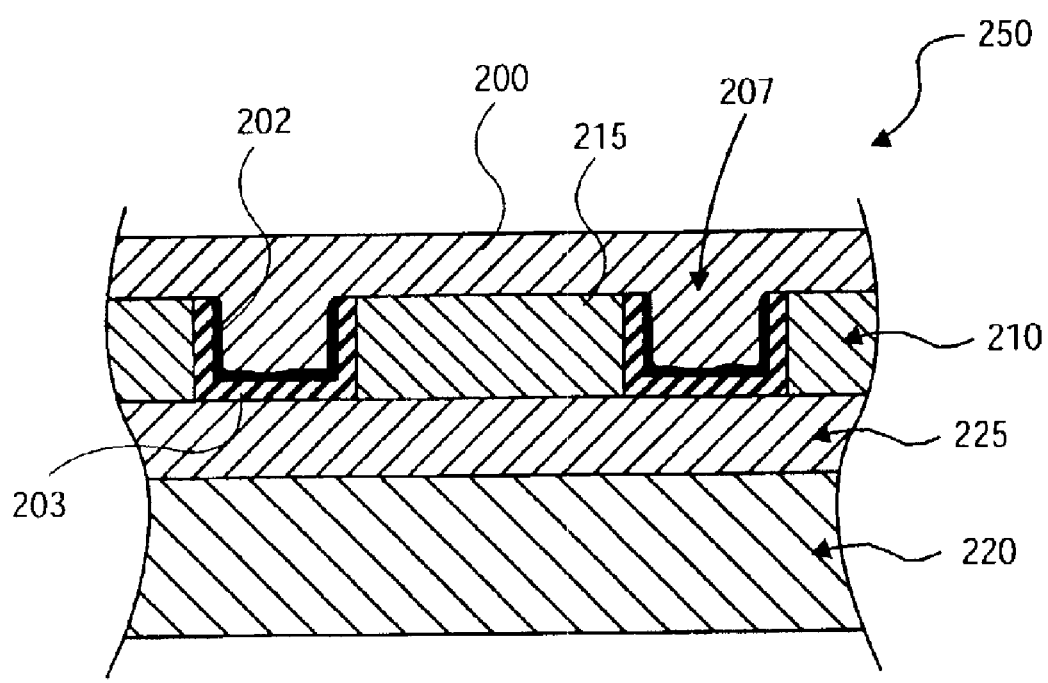
FIG. 2 shows a close-up cross-sectional view of the metal lines during a fabrication stage, according to one embodiment of the invention.

Referring now to FIG. 2, a die 250 is shown in an intermediated stage of fabrication. The die 250 may be part of a larger wafer on which the features of multiple dice are fabricated before the wafer is divided into the individual dice. In the illustrated embodiment, the die 250 includes a substrate 220 which may be of various materials, such as silicon-based materials including silicon-on-saphire or silicon-on-insulator. As shown at block 610 of FIG. 6, a conventional etch stop layer 225 may be deposited above the substrate 220. The etch stop layer 225 may be of silicon-based materials such as silicon carbide or silicon nitride, having greater resistance to subsequently introduced chemical etchants as described below.

The etch stop layer 225 may be deposited by various means, such as plasma enhanced chemical vapor deposition (PECVD). For example, the wafer may be placed in a processing chamber for a PECVD operation where materials to form the etch stop layer 225 are introduced in a gas form. Conventional pressures, temperatures, radio frequencies (RF) and power may be applied to generate a plasma of the gas and cause deposition of the etch stop layer 225. For example, in one embodiment, pressure is maintained between about 2.0 Torr and about 10.0 Torr, a temperature is maintained between about 250° C. and about 450° C., and RF is maintained at standard frequencies and between about 1,600 watts and about 1,800 watts are supplied. Similarly, subsequent material depositions described below may proceed by various techniques, such as PECVD.

Continuing with reference to FIG. 2, an ILD layer 210 is deposited above the etch stop layer 225 and patterned by various photolithographic and masking techniques to form trenches 207. The ILD layer 210 may be made up of conventional ILD material 215, which may use silicon, carbon and oxygen sources during deposition of the ILD layer 210, and may have a dielectric constant of less than about 4 after fabrication.

With additional reference to FIG. 6, the ILD material 215 may be deposited as indicated at block 620 in the form of a layer above the etch stop layer 225. Various known or yet-to-be developed techniques may be used to create ILD layer 210. Photolithographic techniques may be used to create trenches 207 in ILD layer 210. For example, in one embodiment trenches 207 are created as shown in block 630 in the following manner: 1) a layer of photoresist material is deposited on ILD layer 210, 2) the photoresist layer is exposed to a pattern of light or other electromagnetic radiation, 3) the photoresist layer is developed to remove the exposed portions of the photoresist layer (or alternately to remove the non-exposed portions), 4) a chemical etchant is used to etch away the portions of ILD layer 210 that are no longer covered by the photoresist layer (in FIG. 2 these are the trench areas), while the portions of ILD layer 210 that are still covered by the photoresist layer remain intact, and 5) after etching, the remaining photoresist material is removed. After these operations, trenches 207 may have been created in ILD layer 210 all the way down to the etch stop layer 225, which was put in place to stop the etch process at a predetermined depth. This and other methods of creating trenches are well known, and are not described in greater detail to avoid obscuring an understanding of various embodiments of the invention.

Following formation of the trenches 207, a barrier 203 may be deposited as indicated at block 640 of FIG. 6, followed by a seed layer 202 being deposited as indicated at block 650. The barrier 203 may prevent the metal in the conductive structures in trenches 207 from migrating into the material of ILD 210 when the final product is in operation. In one embodiment, a tantalum-based material forms the barrier 203, but other embodiments may use other materials in the barrier (e.g., tungsten, titanium, cobalt, etc.) The purpose and creation of barrier layers is well known and is not described in greater detail to avoid obscuring an understanding of various embodiments of the invention.

In one embodiment the seed layer 202 is between about 100 angstroms and about 3,000 angstroms thick. In an embodiment in which the seed layer 202 is less than about 1,000 angstroms thick, deposition of the seed layer 202 may proceed by conventional atomic layer deposition (ALD) to ensure a substantially uniform thickness. The seed layer may be of various materials, such as copper or a copper alloy.

The use of a seed layer 202 may increase adhesion to the surfaces of the trench 207 by the interconnect material to be subsequently placed into the trenches to form the interconnect. For example, in one embodiment an interconnect material 200 including copper is applied using plating techniques, and plated copper may not adhere well to the materials used in the barrier layer. Initial formation of a thin seed layer 202 of copper using non-plating techniques makes the initial adherence of copper-to-barrier material, while the subsequent plating operation only needs to adhere the copper of the interconnect material to the copper of the seed layer, which is more easily done.

With reference to block 660 of FIG. 6, interconnect material 200 may now be deposited. In one embodiment, the interconnect material 200 is deposited by electroplating techniques as described further below. However, in other embodiments, the interconnect material 200 may be deposited in an electroless manner, or by other known or yet-to-be-developed deposition techniques.

The interconnect material 200 includes a metal such as copper to provide electrical conductivity as described further herein. Copper includes generally low electrical resistance as compared to a material such as aluminum. The interconnect material 200 also includes a dopant of a material that has electropositive standard electrode potential. Additionally, the dopant may have low solubility in the metal used in interconnect material 200.

The ratio of dopant to metal may vary in different applications, depending on various factors. In one embodiment the amount of dopant is less than about 5 atomic (at.) % of the interconnect material. For example, in one embodiment a copper metal and bismuth dopant are used to make up the interconnect material 200. Bismuth is about 0.5% (or less) soluble in copper, and has an electropositive potential of about 0.16V. Therefore, with respect to solubility, any copper bismuth alloy formation within the interconnect material 200 will include no more than about 0.5% bismuth, limiting the effect of bismuth on conductivity. Additionally, because the bismuth includes an electropositive potential (i.e. rather than an electronegative potential) it will not polarize with the copper to inhibit deposition of the interconnect material 200 as also described below.

Embodiments of interconnect materials 200 that include copper as the metal may include dopants of bismuth as noted above. Additional dopant materials having low solubility in copper may be included within the interconnect material 200, such as antimony (Sb), rhenium (Re), and ruthenium (Ru). Similar to Bi, Sb, Re, and Ru are also of electropositive potential. Other materials such as carbon (C) and other additives described below may also be included. Carbon, while not electrically conductive, is readily driven to interfaces as described below and is of low solubility in copper. Particular embodiments may have copper as the metal and a combination of dopants that include Bi, and one or more of C, Sb, Re and Ru (e.g., Cu—Bi, Cu—Bi—C, Cu—Bi—Sb—C, Cu—Bi—Sb, Cu—Bi—Sb—Re, Cu—Bi—Sb—Re—C, Cu—Bi—Sb—Re, Cu—Bi—C—Sb—Ru and Cu—Bi—Sb—Ru). In one embodiment the total amount of dopants is less than 5 at. %, with carbon less than 500 parts per million (ppm), and with other dopant elements in approximately equal ratios, but other embodiments may use other ratios and amounts.

The use of a low solubility dopant promotes the formation of dopant interfaces 105 (see FIG. 1) where the interconnect material 200 includes more dopant than will dissolve with the metal. By utilizing dopants having low solubility in the particular metal of the interconnect material 200, interconnect materials 200 may be created which form dopant interfaces even with very small amounts of dopant. For example, in an embodiment where the dopant is about 0.5% soluble in the metal, but the interconnect material 200 includes 1.5% dopant, 0.5% of the dopant may remain dissolved, while 1% of the dopant may be readily driven to form dopant interfaces.

In one embodiment, the interconnect material 200 is deposited by electroplating or electrodeposition. In electroplating, the die may placed in an electroplating bath containing a liquid that includes the metal and dopant. In a particular embodiment, the metal content is between about 10 grams per liter (g/l) and about 30 g/l of copper, provided by copper sulfate, copper nitrate, or other appropriate copper source, and the dopant content is less than about 0.1 mole (M) per liter of bismuth provided, for example, by bismuth citrate or other appropriate bismuth salt. The electroplating bath may include sulfonic and hydrochloric acids. Additionally, organic additives may be included in the electroplating bath to ensure bottom up fill of the trenches 207 (i.e., plating occurs faster on the horizontal bottom of the trenches than on the sides) and thereby help prevent the formation of trapped voids that might occur if the plating on the two sides of the trench 207 met each other before the trench filled up with the plating material. Such additives may include various substances, such as suppressor polyethers, anti-suppressor di-sulfides, and polyamine or polyamide levelers.

In electroplating, an electric current is run through an anode in contact with the electroplating bath, while the device to be plated is immersed in the bath and acts as a cathode. In electroless plating deposition takes place due to physical and chemical reactions without the need for electrical stimulation.

In one embodiment, the interconnect material 200 includes between about 0.6% and about 5% bismuth—while the interconnect material 200 may include an alloy of up to about 0.5% bismuth, the remainder of the bismuth will be available for formation of the dopant interfaces.

The efficiency of the deposition described above is enhanced by the use of dopants, such as bismuth, having electropositive potentials. Because a metal such as copper also has an electropositive potential, the dopant and the metal fail to polarize when introduced, such as within the electroplating bath. Thus, deposition proceeds uninhibited by polarity of the materials involved. This also allows a smaller amount of dopant to be used in the electroplating bath for the forming of the interconnect material 200 on the die 250.

FIG. 2 shows the interconnect material 200 filling the trenches 207 and covering the surface of ILD layer 210 after the plating operation. Since the interconnect material is needed only in the trenches, various techniques may be used to remove the unwanted interconnect material. In one embodiment chemical mechanical polishing (CMP) is used to effect this removal, as described in block 670 of FIG. 6, by removing all material down to the surface of ILD layer 210. In CMP, a flat polishing disk is used to abrasively remove the surface material from die 250 by polishing the surface, while a chemical slurry is used as a polishing medium to improve the efficiency of the polishing operation. CMP techniques are well known and are not described in greater detail to avoid obscuring an understanding of various embodiments of the invention. While in one embodiment all material is removed down to the surface of ILD layer 210, in another embodiment the removal operation continues further and also removes a thin layer of material from the surface of the ILD layer itself. This may be used to assure that variations in process parameters from one part of the wafer to another do not inadvertently leave interconnect material 200 on the surface of ILD layer 210 after the removal operation is complete.

Although the embodiment of the previous description removed all remaining photoresist material before plating, in another embodiment (not shown) the photoresist material is left on the surface after etching and is removed by the CMP operation. In such an embodiment, the interconnect material of FIG. 2 covers the photoresist material, which in turn covers the non-etched surface areas of ILD layer 210. However, the CMP operation of the previous paragraph may still remove all material down to the surface to the ILD layer, producing the same result.

Figure 3:
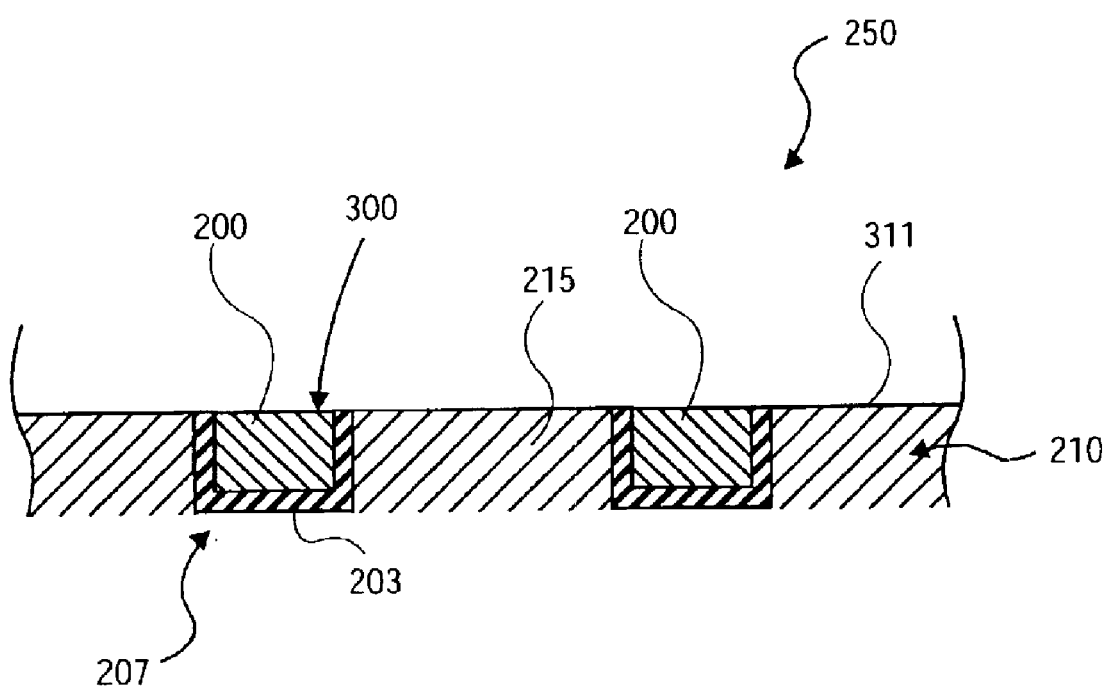
FIG. 3 shows a close-up cross-sectional view of the metal lines of FIG. 2 at a subsequent fabrication stage, according to one embodiment of the invention.

FIG. 3 shows the result after the unwanted interconnect material 200 has been removed from die 250 down to the surface 311 of the ILD layer 210, leaving interconnect material 200 only in the trenches 207. Thus, the ILD layer 210 now includes metal lines 300 separated from each other by ILD material 215. The trenches 207 are also lined with a barrier 203 as shown. However, at this point the dopant may still be distributed relatively uniformly throughout the interconnect material 200.

FIG. 4 shows an individual die 450 with a substrate 420 accommodating an ILD layer 410 having metal lines 430 embedded therein, all of which may be created with the previously described operations. As compared with the embodiments of FIGS. 2 and 3, the etch stop layer and barrier have been omitted from FIG. 4 as not relevant to the subsequent processing. Continuing with reference to FIG. 4, an additional layer 413 is shown above the ILD layer 410. The additional layer may be of various materials. In one embodiment, the additional layer 413 is primarily of ILD material and may include circuit features such as metal filled vias electronically coupled to the metal lines 430 of the ILD layer 410. In this manner coupling may be provided to external features such as a package substrate (e.g., the package substrate 175 of FIG. 1). In various embodiments the layer 413 may contain various features and perform various functions in the overall design of die 450. While in one embodiment the layer 413 is another layer containing interconnect features that may be formed in the manner similar to ILD layer 210, other embodiments may provide other features in layer 413. One or more additional layers (not shown) may also be formed on layer 413. In one embodiment die 450 represents a completely fabricated die, while in another embodiment die 450 represents a partially fabricated die.

At block 680 of FIG. 6, the previously-formed metal lines are annealed to cause the dopant to migrate to the boundaries of the metal lines (e.g., the metal lines 430 of FIG. 4). FIG. 5 shows the die 450 in an annealing oven. Annealing may take place at various stages of the fabrication process, for example: 1) after the CMP operation but before further processing, 2) after an additional layer such as layer 413 has been placed above the metal lines, 3) after all fabrication operations have been completed on the wafer but before separation of the wafer into individual dice, 4) after separation of the wafer into individual dice, 5) etc.

As shown in FIG. 5, the annealing apparatus 550 may include a conveyor belt 525 along which the die 450 is advanced below heating elements 575. The annealing apparatus 550 may be a known or yet-to-be-developed semiconductor processing oven. Similarly, the heating elements 575 may include heated coils, an electromagnetic radiation source, or other sources of thermal energy. In one embodiment the annealing operation may provide a temperature of between about 100° C. and about 500° C., such as about 350° C., for a time of between about 1.5 minutes and about 2.5 hours.

When the die 450 is heated or annealed as indicated above, the dopant in the interconnect material may migrate toward the boundaries of the metal lines, so that much of the dopant is concentrated along the bottom, edges, and top of the metal lines. This may produce metal lines 430 having a metal or metal alloy 501 in the center regions and dopant interfaces 505 having doped metal around the boundaries. For example, in an embodiment where the interconnect material 400 of FIG. 4 includes copper and bismuth, an alloy of copper bismuth metal 501 will remain central to the metal lines 430. At the same time, excess bismuth, unable to alloy with copper as described above, will be driven away, where it will be stopped when it reaches the boundaries. As previously described, even though the metal alloy 501 and dopant interface 505 are shown in the figures as distinct entities, they may actually blend into each other as the concentration of dopant becomes increasingly higher near the boundaries.

While bismuth is of some solubility in copper generally, the excess bismuth is no longer soluble in the copper bismuth metal 501 as it is already accommodating a maximum amount of bismuth. During subsequent operation of the circuit, the excess bismuth in the boundary areas acts as a substantially complete barrier to the migration of copper within the dopant interfaces, thus preventing electromigration of the copper in those areas. Furthermore, the minimal amount of bismuth within the metal 501, due to the low solubility of bismuth in copper, results in minimal effect on the conductivity of the metal lines 430. Thus, even if electromigration creates voids in the center of the conductive lines, the boundaries of the lines (in the form of the dopant interfaces) will continue to provide electrical conductivity around those voids. In addition, the decrease of metal mobility in the doped grain boundaries and interfaces may reduce or eliminate the creation of voids.

Following the annealing operation, the die 450 utilizing metal lines 430 with dopant interfaces 505 may undergo further processing and be coupled to a package substrate to form a semiconductor package, such as the semiconductor package 190 shown in FIG. 1. The semiconductor package may then be coupled to a printed circuit board (PCB) and utilized as part of an electronic device.

Figure 7:
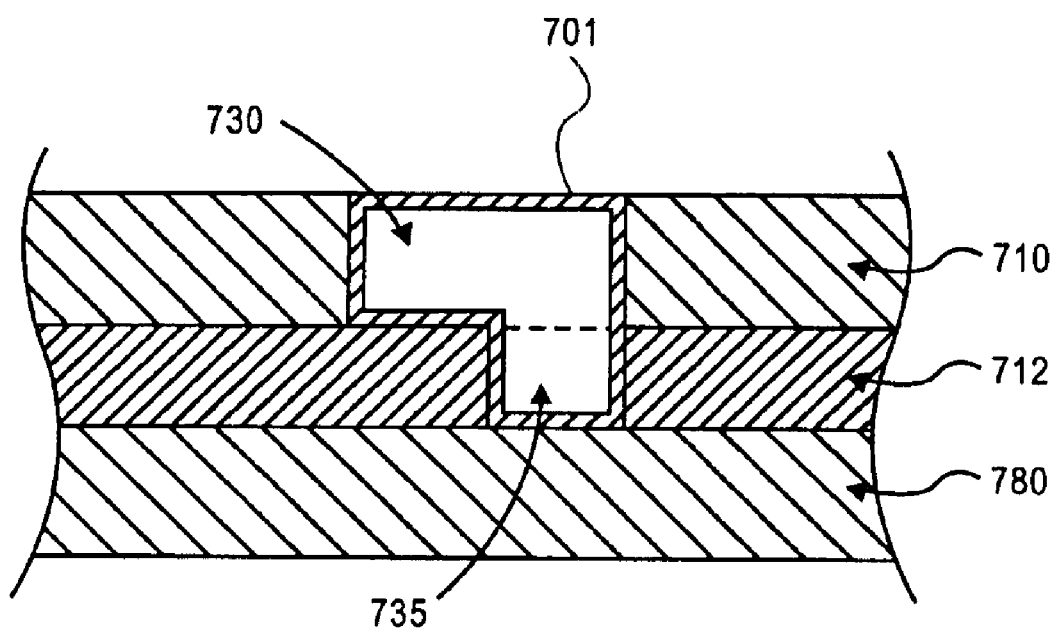
FIG. 7 is a cross-sectional view of a die having a metal line and a connected via, according to one embodiment of the invention.

Embodiments described above include metal lines with dopant interfaces. Other embodiments may include circuit features with physical shapes other than that of metal lines. For example, multilevel features may be processed in the manner described. FIG. 7 shows cross-sectional views of a metal line 730 in layer 710, with a via 735 in layer 712 to connect the metal line to another feature in layer 780 (the feature in level 780 is omitted for clarity). The via and the metal line are shown divided by a dashed line, although they may occupy contiguous space without a physical boundary between them. A hole for the via and a trench for the metal line may be created in any feasible manner before plating. A barrier and a seed layer may be deposited on the bottom and sides of the via and trench in any feasible manner, such as the techniques previously described. The via and line may then be filled with doped interconnect material through any of the techniques previously described. The excess interconnect material may then be removed through a CMP or other operation. Annealing may then be used to cause the dopant to migrate to the boundaries, forming dopant interface 701.

By using uniform parameters in doping, plating, and annealing, the via 735 and the metal line 730 may be treated as a contiguous conductive area, with a relatively uniform dopant interface 701 at all boundaries of both the via and the line. However, other embodiments may create different dopant interfaces in different parts of the line/via regions.

For example, the via may be formed and plated in layer 712 with a first set of parameters to produce a dopant interface with a first set of characteristics in the via (e.g., a certain density of dopant, a certain combination of elements in the dopant, etc). Then the layer 710 may be formed on layer 712, and the line 730 may be formed and plated with a second set of parameters to produce a dopant interface with a second set of characteristics in the line (e.g., a different density of dopant, a different combination of elements in the dopant, etc.). Then both regions may be annealed together. Alternatively, the via 735 may be annealed after the via 735 is plated but before the line 730 is plated. The combination may then be annealed after the line 730 is plated. Since a fully-annealed dopant interface remains relatively unchanged by further annealing, the dopant interface established in the via may not be affected by the further annealing required for the line.

The foregoing description is intended to be illustrative and not limiting. Variations will occur to those of skill in the art. Those variations are intended to be included in the various embodiments of the invention, which are limited only by the spirit and scope of the appended claims.

We claim:

1. A method, comprising:
   forming an interconnect with electrically conductive material comprising metal and a dopant, the dopant comprising bismuth; and
   heating the interconnect to move a portion of the dopant to a boundary of the interconnect.

2. The method of claim 1, wherein:
   said heating comprises exposing the interconnect to a temperature of between about 100° C. and about 500° C.

3. The method of claim 1, wherein:
   said heating comprises heating for between about 1.5 minutes and about 2.5 hours.

4. The method of claim 1, wherein:
   said forming comprises plating.

5. The method of claim 1, wherein:
   the metal comprises copper.

6. The method of claim 1, wherein
   the dopant comprises an electropositive material.

7. The method of claim 1, wherein:
   the dopant also comprises at least one of carbon, antimony, rhenium, and ruthenium.

8. The method of claim 1, wherein:
   the electrically conductive material is plated from a plating bath having less than about 0.1 mole of dopant per liter of bismuth.

9. A method, comprising:
   etching a trench in an inter-layer dielectric;
   depositing a barrier in the trench;
   depositing a seed layer on the barrier;
   filling the trench with an electrically conductive material containing copper and a dopant having bismuth;
   removing an excess of the electrically conductive material with a chemical mechanical polishing operation; and
   heating the inter-layer dielectric to migrate a portion of the dopant to a region near the barrier.

10. The method of claim 9, wherein:
    the dopant has an electropositive standard potential.

11. The method of claim 10, wherein:
    the dopant comprises at least one of carbon, antimony, rhenium, and ruthenium.

12. The method of claim 9, wherein:
    said filling comprises an electroplating operation.

13. The method of claim 12, wherein:
    the electroplating operation comprises a liquid having a material selected from a group consisting of sulfonic acid, hydrochloric acid, carbon, a suppressor polyether, an anti-suppressor di-sulfide, a polyamine leveler, and a polyamide leveler.

14. The method of claim 12, wherein:
    the liquid comprises about 0.1 moles of bismuth and between about 10 grams per liter and about 30 grams per liter of copper.

15. The method of claim 9, wherein:
    the dopant is less than about 5% soluble by weight in the copper.

16. A method comprising:
    forming a trench in a first layer of a wafer and a via in a second layer beneath the first layer, the via being open to the trench;
    electroplating a first conductive material in the via, the first conductive material having a first metal and a first dopant containing bismuth;
    electroplating a second conductive material in the trench in contact with the first conductive material, the second conductive material having a second metal and a second dopant containing bismuth; and
    heating the first and second conductive materials to migrate a portion of the first dopant to a boundary of the via and a portion of the second dopant to a boundary region of the trench.

17. The method of claim 16, wherein:
    the migrated first dopant has a different density than the migrated second dopant.

18. The method of claim 16, wherein:
    the migrated first dopant has a different combination of elements than the migrated second dopant.

* * * * *